(12) United States Patent
Cha et al.

(10) Patent No.: US 12,356,716 B2
(45) Date of Patent: Jul. 8, 2025

(54) DISPLAY DEVICE AND METHOD OF MANUFACTURING THE SAME

(71) Applicant: Samsung Display Co., LTD., Yongin-si (KR)

(72) Inventors: Jong Hwan Cha, Suwon-si (KR); Ki Nyeng Kang, Sejong-si (KR); Jun Ho Bae, Asan-si (KR); Hee Jung Yoon, Hwaseong-si (KR); Su Min Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 615 days.

(21) Appl. No.: 17/694,007

(22) Filed: Mar. 14, 2022

(65) Prior Publication Data
US 2022/0302178 A1 Sep. 22, 2022

(30) Foreign Application Priority Data

Mar. 17, 2021 (KR) .................. 10-2021-0034582

(51) Int. Cl.
*H10D 86/60* (2025.01)
*H01L 23/00* (2006.01)
(Continued)

(52) U.S. Cl.
CPC ........... *H10D 86/60* (2025.01); *H01L 25/167* (2013.01); *H10D 86/0251* (2025.01);
(Continued)

(58) Field of Classification Search
CPC ............... H01L 27/1244; H01L 25/167; H01L 27/1296; H01L 24/24; H01L 24/95; H01L 33/44; H01L 2224/24011; H01L 2224/24051; H01L 2224/24146; H01L 2224/245; H01L 2224/95101; H01L 2224/95133; H01L 2924/12041; H01L 33/20; H01L 33/62; H01L 25/0753; H01L 27/1248; H01L 27/156; H10K 59/123; H10K 59/122; H10K 59/1213; H10K 59/124; H10D 86/443; H10D 86/60; H10D 86/0251; H10D 86/451; H10H 20/84; H10H 29/842; H10H 29/8517; H10H 29/8552; H10H 20/819; H10H 20/857; H10H 29/49;
(Continued)

(56) References Cited

U.S. PATENT DOCUMENTS 10,374,028 B1 * 8/2019 Lim ................... H10K 59/124
10,698,523 B2 6/2020 Jang et al.
(Continued)

FOREIGN PATENT DOCUMENTS

JP 2017223949 12/2017
KR 10-2019-0029831 3/2019
(Continued)

*Primary Examiner* — Douglas W Owens
(74) *Attorney, Agent, or Firm* — KILE PARK REED & HOUTTEMAN PLLC

(57) ABSTRACT

A display device comprises a substrate including a display area and a pad area adjacent to the display area; at least one pad electrode disposed on the substrate in the pad area and connected to the display area; and at least one dummy electrode overlapping the at least one pad electrode and not connected to the display area.

22 Claims, 19 Drawing Sheets

(51) Int. Cl.
    *H01L 25/16*     (2023.01)
    *H10D 86/01*     (2025.01)
    *H10D 86/40*     (2025.01)
    *H10H 20/84*     (2025.01)

(52) U.S. Cl.
    CPC ........... *H10D 86/443* (2025.01); *H01L 24/24* (2013.01); *H01L 24/95* (2013.01); *H01L 2224/24011* (2013.01); *H01L 2224/24051* (2013.01); *H01L 2224/24146* (2013.01); *H01L 2224/245* (2013.01); *H01L 2224/95101* (2013.01); *H01L 2224/95133* (2013.01); *H01L 2924/12041* (2013.01); *H10H 20/84* (2025.01)

(58) Field of Classification Search
    CPC .. H10H 29/857; H10H 29/922; H10H 29/942; H10H 29/14
    See application file for complete search history.

(56) References Cited

U.S. PATENT DOCUMENTS

| | | | |
|---|---|---|---|
| 11,227,900 B2 | 1/2022 | Song et al. | |
| 11,249,588 B2 | 2/2022 | Jang et al. | |
| 2020/0312923 A1* | 10/2020 | Kim | H10K 50/844 |
| 2021/0175460 A1* | 6/2021 | Baek | H10K 59/80522 |
| 2022/0317508 A1* | 10/2022 | Wang | H01L 27/1259 |

FOREIGN PATENT DOCUMENTS

| | | |
|---|---|---|
| KR | 10-2020-0071714 | 6/2020 |
| KR | 10-2020-0088951 | 7/2020 |
| KR | 20200094885 | 8/2020 |

\* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0034582 under 35 U.S.C. § 119 filed on Mar. 17, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode may include an organic light emitting diode using an organic material as a light emitting material and an inorganic light emitting diode using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that prevents a short-circuit failure between a first electrode and a second electrode adjacent to a pad area.

Aspects of the disclosure also provide a method of manufacturing a display device that prevents a short-circuit failure between a first electrode and a second electrode adjacent to a pad area.

However, aspects of the disclosure are not restricted to those set forth herein. The above and other aspects of the disclosure will become more apparent to one of ordinary skill in the art to which the disclosure pertains by referencing the detailed description of the disclosure given below.

According to an example embodiment, a display device may include a substrate including a display area and a pad area adjacent to the display area; at least one pad electrode disposed on the substrate in the pad area and connected to the display area; and at least one dummy electrode overlapping the at least one pad electrode and not connected to the display area.

The display device of claim 1, wherein the at least one dummy electrode may include a first dummy electrode portion overlapping an end of the at least one pad electrode; and a second dummy electrode portion overlapping another end of the at least one pad electrode, and the first dummy electrode portion and the second dummy electrode portion are spaced apart from each other in a first direction.

The at least one dummy electrode may include a plurality of dummy electrodes, and the at least one pad electrode may include a plurality of pad electrodes.

The plurality of dummy electrodes may include the dummy electrode not overlapping the at least one pad electrode.

The plurality of dummy electrodes and the plurality of pad electrodes may be disposed in a second direction intersecting the first direction, respectively.

The display device of claim 5, wherein ends of first dummy electrode portions of the plurality of dummy electrodes extend in the second direction to form a first extension line, ends of second dummy electrode portions of the plurality of dummy electrodes extend in the second direction to form a second extension line, and an opening may be a space formed by the first dummy electrode portion and the second dummy electrode portion spaced apart from each other in the first direction, may be formed in a space between the first extension line and the second extension line, and extends in the second direction.

The opening may overlap the at least one pad electrode.

The display device may further include at least one lower insulating layer disposed on the at least one pad electrode; a via layer disposed on the at least one lower insulating layer; and a first insulating layer disposed on the via layer, wherein the substrate, the at least one pad electrode, the at least one lower insulating layer, the a via layer, and the a first insulating layer may be disposed in the opening, and the first insulating layer may include first insulating patterns spaced apart from each other with a space overlapping the at least one pad electrode disposed between the first insulating patterns.

The display device may further include a second insulating layer disposed on the first insulating layer, wherein the second insulating layer may include second insulating patterns overlapping the first insulating patterns in the opening.

The first insulating pattern may include a groove recessed downward from a top surface of the first insulating pattern, and the second insulating pattern fills the groove of the first insulating pattern.

The display device may further include a third insulating layer disposed on the second insulating layer, wherein the third insulating layer directly contacts top surfaces of the first insulating pattern, the second insulating pattern, and the via layer.

According to another example embodiment, a display device may include a substrate including a display area and a pad area adjacent to the display area; a pad electrode disposed on the substrate and connected to the display area; at least one lower insulating layer disposed on the pad electrode; a via layer disposed on the at least one lower insulating layer; a first insulating layer disposed on the via layer; and a second insulating layer disposed on the first insulating layer, wherein the first insulating layer may include first insulating patterns spaced apart from each other with a space overlapping the pad electrode disposed between the first insulating patterns, and the second insulating layer may include second insulating patterns overlapping the first insulating patterns.

The first insulating pattern may include a groove recessed downward from a top surface of the first insulating pattern, and the second insulating pattern may fill the groove of the first insulating pattern.

A width of the second insulating pattern may be less than a width of the first insulating pattern.

The second insulating pattern may not overlap the pad electrode.

The display device may further include a third insulating layer disposed on the second insulating layer, wherein the third insulating layer directly contacts top surfaces of the first insulating pattern, the second insulating pattern, and the via layer.

According to another example embodiment, a method of manufacturing a display device may include preparing a substrate including a display area and a pad area adjacent to the display area; disposing pad electrodes connected to the display area on the pad area; disposing a via layer on the pad electrodes; and disposing dummy electrodes to overlap the pad electrode on the via layer, wherein the dummy electrode is not connected to the display area.

The method may further include forming, between dummy electrodes adjacent to each other, first insulating patterns spaced apart from each other with a space overlapping the pad electrode disposed between the first insulating patterns.

The method may further include forming second insulating patterns overlapping the first insulating patterns, wherein the forming of the second insulating patterns may include filling a groove of the first insulating pattern recessed downward from a top surface of the first insulating pattern with the second insulating pattern.

The method may further include etching the dummy electrodes.

In the display device and the method of manufacturing the same according to embodiments, it is possible to prevent a short-circuit failure between the first electrode and the second electrode adjacent to the pad area.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Figure 1:
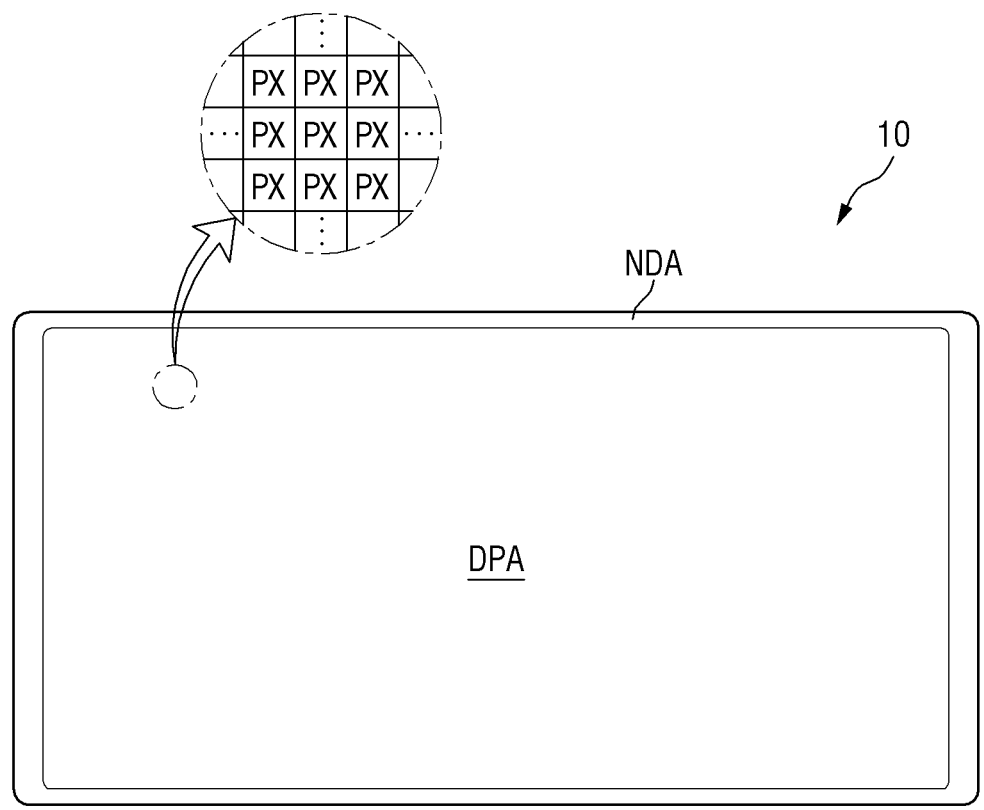
FIG. 1 is a schematic plan view illustrating a display device according to one embodiment.
Figure 1:
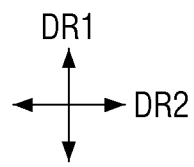

Structural and functional descriptions of embodiments disclosed herein are only for illustrative purposes. The disclosure may be embodied in many different forms without departing from the spirit and scope of the disclosure. Therefore, embodiments are disclosed only for illustrative purposes and should not be construed as limiting the disclosure. For example, the disclosure may be defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

It will be understood that the terms "connected to" or "coupled to" may include a physical or electrical connection or coupling.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprises" and/or "comprising," or "includes" and/or "including" and variations thereof when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements may then be oriented on "upper" sides of the other elements. The example term "lower," can therefore, encompasses both an orientation of "lower" and "upper," depending on the orientation of the figure. Similarly, if the device in one of the figures is turned over, elements described as "below" or "beneath" other elements may then be oriented "above" the other elements. The example terms "below" or "beneath" can, therefore, encompass both an orientation of above and below.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and should not be interpreted in an idealized or overly formal sense unless expressly so defined herein.

Example embodiments are described herein with reference to cross section illustrations that are schematic illustrations of embodiments. As such, variations from the shapes of the illustrations as a result, for example, of manufacturing techniques and/or tolerances, are to be expected. Thus, embodiments described herein should not be construed as limited to the shapes of regions as illustrated herein but are to include deviations in shapes that result, for example, from manufacturing. For example, a region illustrated or described as flat may, for example, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described with reference to the attached drawings.

FIG. 1 is a schematic plan view illustrating a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described as an example, but the disclosure is not limited thereto, and other display panels may be applied within the spirit and scope of the disclosure.

The shape of the display device 10 may be variously modified. For example, the display device 10 may have a shape such as a substantially rectangular shape elongated in a horizontal direction, a substantially rectangular shape elongated in a vertical direction, a substantially square shape, a substantially quadrilateral shape with rounded corners (vertices), another substantially polygonal shape and a substantially circular shape. The shape of a display area DPA of the display device 10 may also be substantially similar to the overall shape of the display device 10. FIG. 1 illustrates a display device 10 having a substantially rectangular shape elongated in a second direction DR2.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged or disposed in a matrix. The shape of each pixel PX may be a substantially rectangular or substantially square shape in a plan view. However, the disclosure is not limited thereto, and it may be a substantially rhombic shape in which each side is inclined with respect to one direction. The pixels PX may be disposed in a stripe type or a PENTILE™ type. Each of the pixels PX may include one or more light emitting elements that emit light of a specific or given wavelength band to display a specific or given color.

The non-display area NDA may be disposed around or may be adjacent to the display area DPA. The non-display area NDA may completely or partially surround the display area DPA. The display area DPA may have a substantially rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
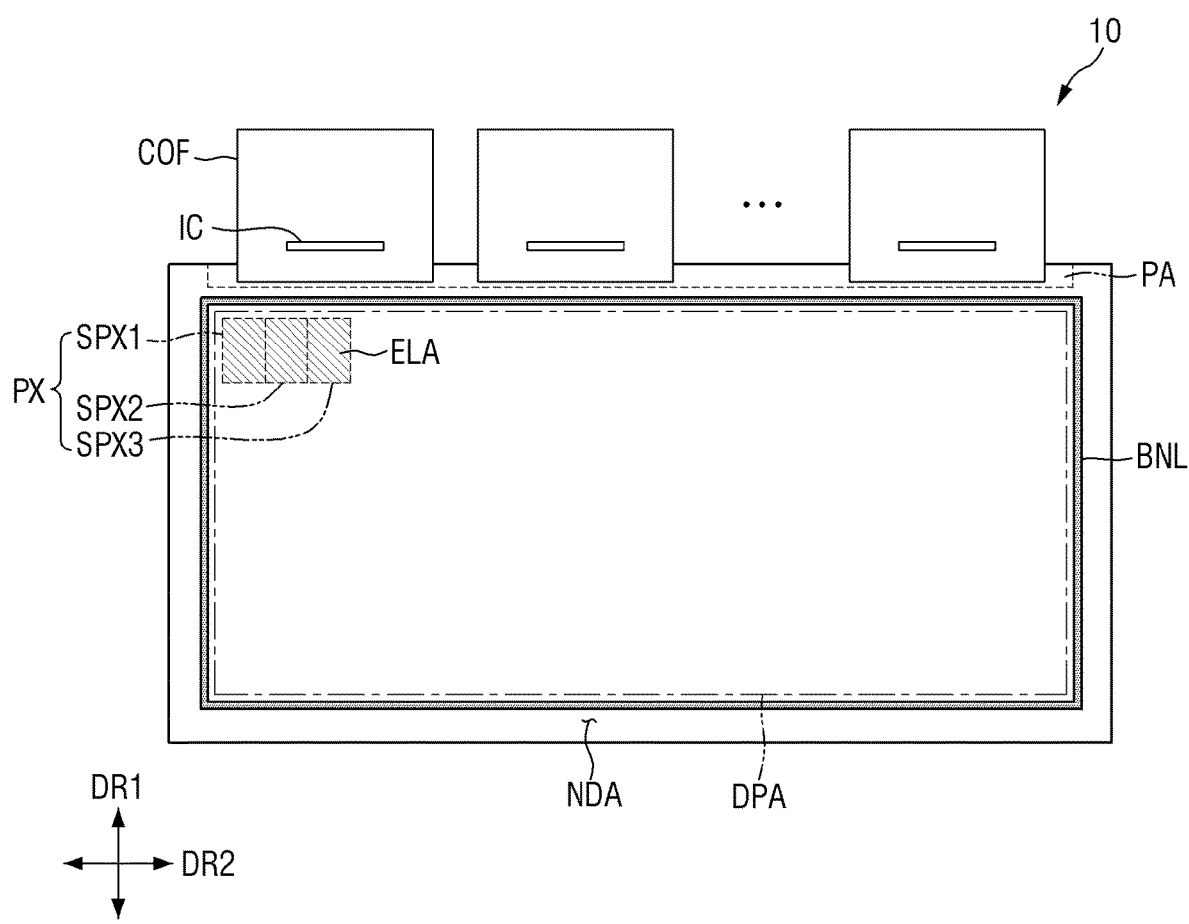
FIG. 2 is a schematic diagram illustrating a display area and a non-display area of a display device according to one embodiment.

FIG. 2 is a schematic diagram illustrating a display area and a non-display area of a display device according to one embodiment.

Referring to FIG. 2, the display device 10 according to one embodiment may include light emitting element arrays ELA disposed in the display area DPA. Pixels PX arranged or disposed in a first direction DR1 and a second direction DR2 may be disposed in the display area DPA of the display device 10, and one pixel PX may include sub-pixels SPXn arranged or disposed in one direction. The sub-pixels SPXn may be arranged or disposed in the first direction DR1 and the second direction DR2 in the display area DPA, and some or a part of them may form one pixel PX.

Each of the sub-pixels SPXn may include the light emitting element array ELA including a light emitting element ED (see FIG. 3) and an electrode connected to the light emitting element ED. The light emitting element array ELA may be electrically connected to conductive layers thereunder and may receive an electric signal applied from the conductive layer to emit light from the light emitting element ED. The light emitting element array ELA may receive a power source from a power supply device included in the display device 10 to emit light.

A semiconductor element array (not shown) may be disposed in a part of the non-display area NDA. As one example, the semiconductor element array may be disposed on both sides in the second direction DR2 of the display area DPA. However, the disclosure is not limited thereto, and the semiconductor element array may be disposed in another region of the non-display area NDA, or may be disposed in larger number.

The non-display area NDA may include a pad area PA. The pad area PA may be disposed adjacent to an upper side of four sides of the display area DPA, in the non-display area NDA around the display area DPA.

The display device 10 according to one embodiment may further include a chip-on film COF attached to the pad area PA. The chip-on film COF may include a flexible film such as polyimide (PI). Chip-on films COF may be provided. The chip-on films COF may be arranged or disposed along the second direction DR2. A data driving integrated circuit may be mounted on the chip-on-film COF. The data driving integrated circuit may be implemented in the form of a driving chip. For example, the data driving integrated circuit may include a data driving chip IC.

Hereinafter, a structure of one pixel PX included in the light emitting element array ELA of the display device 10 according to one embodiment will be described in detail with further reference to other drawings.

Figure 3:
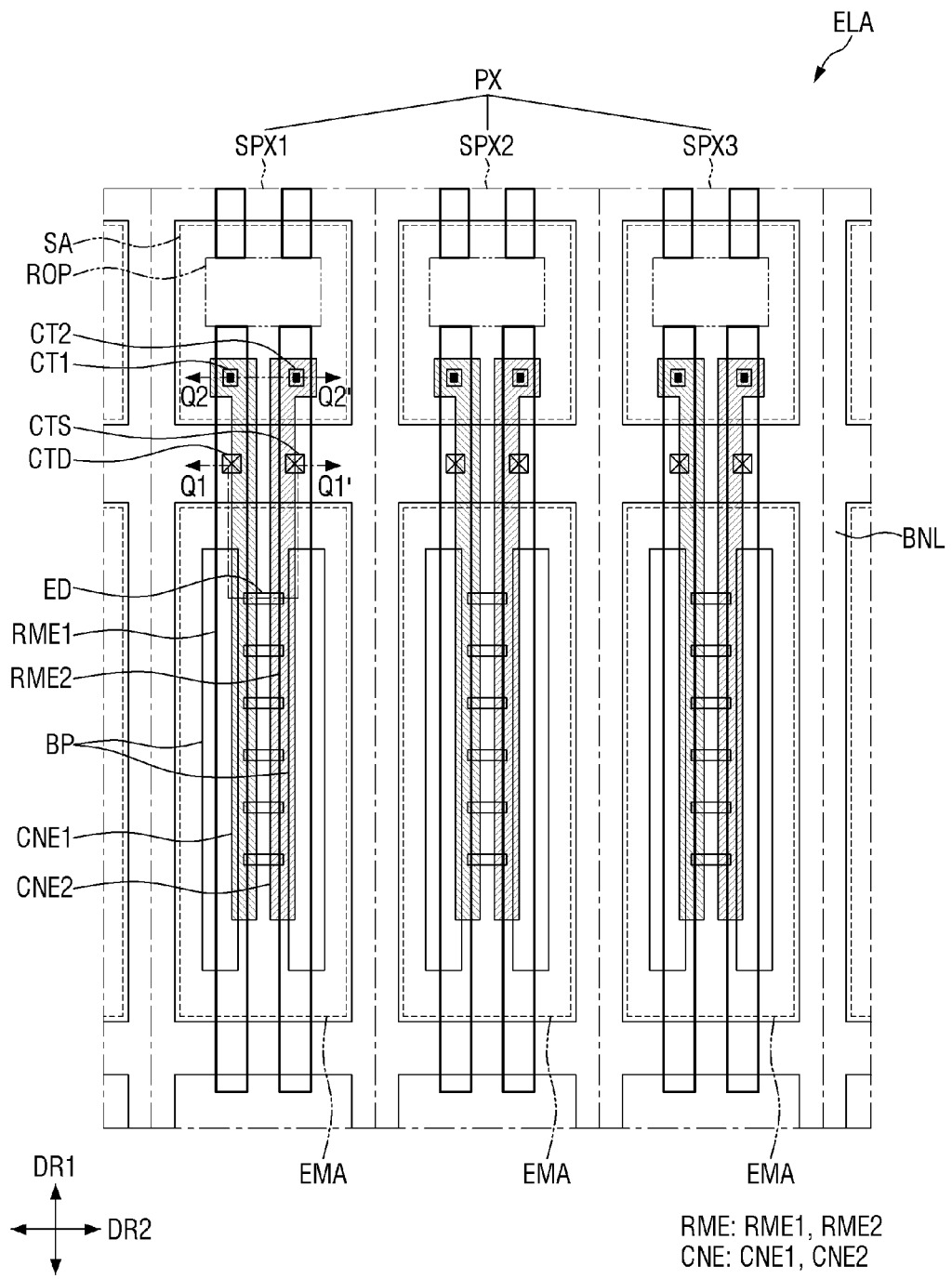
FIG. 3 is a schematic plan view showing one pixel included in a display device according to one embodiment.

FIG. 3 is a schematic plan view showing one pixel included in a display device according to one embodiment.

Figure 4:
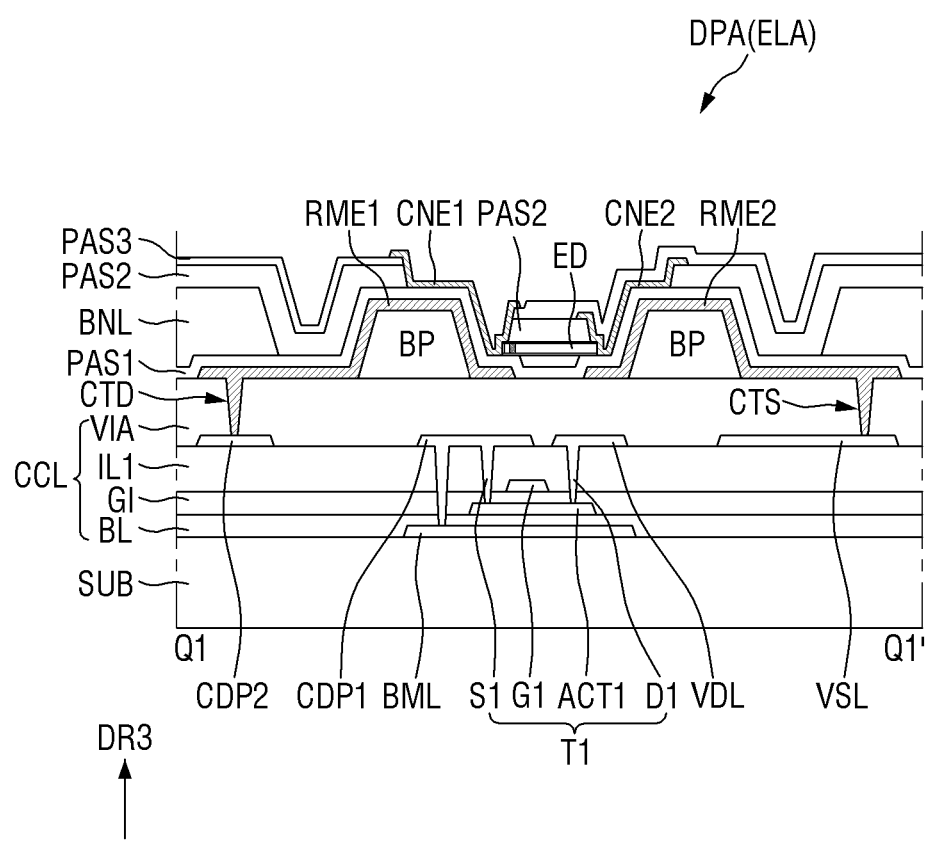
FIG. 4 is a schematic cross-sectional view taken along line Q1-Q1' of FIG. 3.
Figure 5:
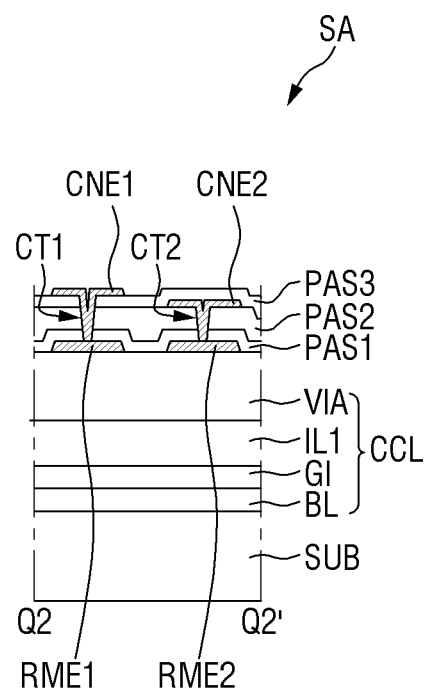
FIG. 5 is a schematic cross-sectional view taken along line Q2-Q2' of FIG. 3.

FIG. 4 is a schematic cross-sectional view taken along line Q1-Q1' of FIG. 3. FIG. 5 is a schematic cross-sectional view taken along line Q2-Q2' of FIG. 3.

FIG. 4 illustrates a cross section that traverses both ends of the light emitting element ED included in the light emitting element array ELA. FIG. 5 illustrates a cross section that traverses contact portions CT1 and CT2 disposed in one sub-pixel SPXn.

Referring to FIGS. 3 to 5, each of the pixels PX of the display device 10 may include sub-pixels SPXn (n ranging from 1 to 3). For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In one embodiment, each of the sub-pixels SPXn may emit blue light. Although FIG. 3 illustrates that one pixel PX may include three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area where the light emitting elements ED are aligned to emit light of a certain or given wavelength band. The non-emission area may be an area where there is no light emitting element ED and the lights emitted from the light emitting elements ED do not reach, so that no light is emitted. The emission area may include an area in which the light emitting element ED is disposed, and an area adjacent to the light emitting element ED to emit light emitted from the light emitting element ED.

Without being limited thereto, the emission area EMA may also include an area in which light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In an embodiment, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA may be disposed at one side or a side of the emission area EMA in the first direction DR1, and may be disposed between the emission areas EMA of the sub-pixels SPXn adjacent in the first direction DR1. For example, the emission areas EMA and the sub-regions SA may be repeatedly arranged or disposed in the second direction DR2, respectively, while being alternately arranged or disposed in the first direction DR1. However, the disclosure is not limited thereto, and the arrangement of the emission areas EMA and the sub-regions SA in the pixels PX may be different from that shown in FIG. 3.

A bank BNL may be disposed between the sub-regions SA and between the emission areas EMA, and the distance therebetween may vary with the width of the bank BNL. Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The bank BNL may include portions extending in the first direction DR1 and the second direction DR2 in a plan view to be arranged or disposed in a grid pattern over the entire surface of the display area DPA. The bank BNL may be disposed along the boundaries between the sub-pixels SPXn to delimit the neighboring sub-pixels SPXn. Further, the bank BNL may be disposed so as to surround the emission area EMA disposed for each sub-pixel SPXn to distinguish the emission areas EMA.

The display device 10 may include a first substrate SUB, an active layer disposed on the first substrate SUB, conductive layers, and insulating layers. The semiconductor layer, the conductive layers, and the insulating layers may each constitute a circuit layer CCL and a display element layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded or rolled.

A first conductive layer may be disposed on the first substrate SUB. The first conductive layer may include a lower metal layer BML that may overlap an active layer ACT1 of a first transistor T1. The lower metal layer BML may include a material of blocking light to prevent light from reaching the active layer ACT1 of the first transistor T1.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The active layer is disposed on the buffer layer BL. The active layer may include the first active layer ACT1 of the first transistor T1. The first active layer ACT1 of the first transistor T1 may be disposed to partially overlap a first gate electrode G1 of a second conductive layer to be described later.

The active layer may include polycrystalline silicon, monocrystalline silicon, oxide semiconductor, and the like within the spirit and the scope of the disclosure. In an embodiment, the active layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the disclosure is not limited thereto, and the display device 10 may include a larger number of transistors.

The first gate insulating layer GI is disposed on the active layer and the buffer layer BL. The first gate insulating layer GI may serve as a gate insulating layer of the first transistor T1.

The second conductive layer may be disposed on the first gate insulating layer GI. The second conductive layer may include the first gate electrode G1 of the first transistor T1.

The first gate electrode G1 may be arranged or disposed to overlap the channel region of the first active layer ACT1 in the third direction DR3 which is the thickness direction.

A first interlayer insulating layer IL1 may be disposed on the second conductive layer. The first interlayer insulating layer IL1 may function as an insulating layer between the second conductive layer and other layers disposed thereon, and may protect the second conductive layer.

A third conductive layer may be disposed on the first interlayer insulating layer IL1. The third conductive layer may include voltage wires VDL and VSL, and electrode patterns CDP1 and CDP2.

A first voltage wire VDL and a second voltage wire VSL may each be disposed in the display area DPA and connected to the light emitting element array ELA of each sub-pixel SPXn. The first voltage wire VDL may be applied with a high potential voltage (or a first power voltage) transmitted to the first electrode RME1, and the second voltage wire VSL may be applied with a low potential voltage (or a second power voltage) transmitted to the second electrode RME2. A part of the first voltage wire VDL may be in contact with the first active layer ACT1 of the first transistor T1 through the contact hole penetrating the first interlayer insulating layer IL1 and the first gate insulating layer GI. The first voltage wire VDL may serve as a first drain electrode D1 of the first transistor T1.

In an embodiment, the first voltage wire VDL may be applied with the first power voltage, and the first transistor T1 may be connected to the first voltage wire VDL. The first voltage wire VDL may serve as the first drain electrode D1 of the first transistor T1.

Although not shown in the drawing, the voltage wires VDL and VSL may have a shape extending in the first direction DR1 in the display area DPA and the non-display area NDA. Further, each of the voltage wires VDL and VSL may further include a portion extending in the second direction DR2 in the display area DPA and the non-display area NDA, and the same voltage wires may be connected to each other while including the portion extending in the second direction DR2. The voltage wires VDL and VSL may be arranged or disposed in a mesh type structure on the entire display device 10.

The first electrode pattern CDP1 may be in contact with the first active layer ACT1 of the first transistor T1 through the contact hole penetrating the first interlayer insulating layer IL1 and the first gate insulating layer GI. Further, the first electrode pattern CDP1 may be in contact with the lower metal layer BML, through another contact hole. The first electrode pattern CDP1 may serve as a first source electrode S1 of the first transistor T1.

The second electrode pattern CDP2 may be electrically connected to the first transistor T1 through the first electrode pattern CDP1. Although it is illustrated in the drawing that the first electrode pattern CDP1 and the second electrode pattern CDP2 are spaced apart from each other, the first electrode pattern CDP1 and the second electrode pattern CDP2 may be connected to each other directly or through a pattern of another layer. In an embodiment, the second electrode pattern CDP2 may be integrated with the first electrode pattern CDP1 to form a single pattern. The second electrode pattern CDP2 may also be connected to the first electrode RME1, and the first transistor T1 may transmit the first power voltage applied from the first voltage wire VDL to the first electrode RME1.

On the other hand, although it is illustrated in the drawing that the first electrode pattern CDP1 and the second electrode pattern CDP2 are formed on a same layer, the disclosure is not limited thereto. In an embodiment, the second electrode pattern CDP2 may be formed as a fourth conductive layer disposed on the third conductive layer with several insulating layers interposed between the first electrode pattern CDP1 and another conductive layer, for example, the third conductive layer. The voltage wires VDL and VSL may also be formed as the fourth conductive layer instead of the third conductive layer, and the first voltage wire VDL may be electrically connected to the first drain electrode D1 of the first transistor T1 through another conductive pattern. Further, although it is not illustrated in the drawing, each of the second conductive layer and the third conductive layer may further include a capacitance electrode of a storage capacitor. The capacitance electrodes of the storage capacitor may be arranged or disposed in different layers and form a capacitor in the first interlayer insulating layer IL1 therebetween. In an embodiment, each of the capacitance electrodes of the storage capacitor may be formed integrally with the first gate electrode G1 and the source electrode S1 of the first transistor T1. However, the disclosure is not limited thereto.

The buffer layer BL, the first gate insulating layer GI, and the first interlayer insulating layer IL1 described above may be formed of inorganic layers stacked in an alternating manner. For example, the buffer layer BL, the first gate insulating layer GI, and the first interlayer insulating layer IL1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer BL, the first gate insulating layer GI, and the first interlayer insulating layer IL1 may be formed as a single inorganic layer containing the above-described insulating material. Further, in an embodiment, the first interlayer insulating layer IL1 may be made of an organic insulating material such as polyimide (PI) or the like within the spirit and the scope of the disclosure.

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The via layer VIA is disposed on the third conductive layer. The via layer VIA may include an organic insulating material, for example, an organic insulating material such as polyimide (PI), to perform a surface planarization function.

The electrodes RME (RME1 and RME2,), protruding patterns BP, the bank BNL, the light emitting elements ED, the semiconductor element, and connection electrodes CNE (CNE1 and CNE2) are disposed on the via layer VIA. Further, insulating layers PAS1, PAS2, and PAS3 may be disposed on the via layer VIA. Although electrodes RME1 and RME2 are illustrated, the electrodes RME may include more than two electrodes, RME1 and RME2.

The protruding patterns BP may be disposed on or directly disposed on the via layer VIA in the display area DPA. The protruding patterns BP may have a shape extending in the first direction DR1 and be spaced apart from each other in the second direction DR2. For example, the protruding pattern BP may extend in the first direction DR1 in the emission area EMA of each sub-pixel SPXn, and may be disposed at both sides in the second direction DR2 with respect to the center of the emission area EMA. The protruding patterns BP may be spaced apart from each other in the second direction DR2, and the light emitting elements ED may be disposed therebetween.

The length of the protruding patterns BP extending in the first direction DR1 may be smaller than the length in the first direction DR1 of the emission area EMA surrounded by the bank BNL. The protruding patterns BP may be arranged or disposed in the emission area EMA of the sub-pixel SPXn in the entire display area DPA to form an island-shaped pattern or a substantially island-shaped pattern having a small width and extending in one direction.

The protruding pattern BP may have a structure in which at least a part thereof protrudes with respect to the top surface of the via layer VIA. The protruding part of the protruding pattern BP may have inclined side surfaces, and the light emitted from the light emitting element ED may be reflected by the electrode RME disposed on the protruding pattern BP and emitted in an upward direction from the via layer VIA. However, the disclosure is not limited thereto, and the protruding pattern BP may have a substantially semicircular or a substantially semi-elliptical shape having a substantially curved outer surface. The protruding pattern BP may include an organic insulating material such as polyimide (PI), but is not limited thereto.

Among the electrodes RME, the first electrode RME1 and the second electrode RME2 are disposed in the display area DPA. The first electrode RME1 and the second electrode RME2 have a shape extending in one direction and may be arranged or disposed for each sub-pixel SPXn. The first electrode RME1 and the second electrode RME2 may be arranged or disposed over at least the emission area EMA and the sub-region SA of the sub-pixel SPXn while extending in the first direction DR1, and may be spaced apart from each other in the second direction DR2.

The first electrode RME1 and the second electrode RME2 may be disposed to be spaced apart in the first direction DR1 in the emission area EMA, and may be partially disposed in the sub-region SA of the corresponding sub-pixel SPXn and another sub-pixel SPXn adjacent in the first direction DR1 over the bank BNL. The first electrode RME1 and the second electrode RME2 of different sub-pixels SPXn may be separated with respect to the separation portion ROP located or disposed in the sub-region SA of one sub-pixel SPXn.

The arrangement of the first electrode RME1 and the second electrode RME2 may be formed in such a way that the electrode is formed as a single electrode line extending in the first direction DR1, the light emitting elements ED may be arranged or disposed, and in a subsequent process, the electrode line is separated. The electrode line may be used to generate an electric field in the sub-pixel SPXn in order to align the light emitting elements ED during the manufacturing process of the display device 10. After aligning the light emitting elements ED, the electrode line may be separated at the separation portion ROP to form the first electrode RME1 and the second electrode RME2 separated in the first direction DR1.

The first electrode RME1 and the second electrode RME2 may be disposed on different protruding patterns BP, respectively. The first electrode RME1 may be located or disposed on the left side with respect to the center of the emission area EMA, and may be partially disposed on the protruding pattern BP located or disposed on the left side. The second electrode RME2 is located or disposed on the right side with respect to the center of the emission area EMA while being spaced apart from the first electrode RME1 in the second direction DR2. The second electrode RME2 may be partially disposed on the protruding pattern BP located or disposed on the right side.

The first electrode RME1 and the second electrode RME2 may be arranged or disposed at least on the inclined side surfaces of the protruding pattern BP. In one embodiment, the width of the electrodes RME measured in the second direction DR2 may be smaller than the width of the protruding pattern BP or the bank BNL measured in the second direction DR2. The first electrode RME1 and the second electrode RME2 may cover or overlap at least one side surface or a side surface of the protruding pattern BP to reflect light emitted from the light emitting element ED.

Further, the gap between the first electrode RME1 and the second electrode RME2 in the second direction DR2 may be smaller than the gap between the protruding patterns BP. At least a part of the first electrode RME1 and the second electrode RME2 may be arranged or disposed on or directly arranged or disposed on the via layer VIA, so that the first electrode RME1 and the second electrode RME2 may be arranged or disposed on a same plane and may be coplanar.

The first electrode RME1 and the second electrode RME2 may be connected to the third conductive layer through a first electrode contact hole CTD and a second electrode contact hole CTS, respectively, which may be formed in portions overlapping the bank BNL. The first electrode RME1 may be in contact with the second electrode pattern CDP2 through the first electrode contact hole CTD penetrating the via layer VIA thereunder. The second electrode RME2 may be in contact with the second voltage wire VSL through the second electrode contact hole CTS penetrating the via layer VIA thereunder. The first electrode RME1 may be electrically connected to the first transistor T1 through the second electrode pattern CDP2 and the first electrode pattern CDP1 and applied with the first power voltage. The second electrode RME2 may be electrically connected to the second voltage wire VSL and applied with the second power voltage.

The first electrode RME1 and the second electrode RME2 may be electrically connected to the light emitting element ED. The first electrode RME1 and the second electrode RME2 may be connected to the light emitting element ED through the connection electrodes CNE (CNE1 and CNE2) to be described later, and may transmit the electrical signal applied from the lower conductive layer to the light emitting element ED.

Each of the electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like within the spirit and the scope of the disclosure. The electrode RME may reflect the light emitted from the light emitting element ED and proceeding toward the side surface of the protruding pattern BP in an upward direction from each sub-pixel SPXn.

However, the disclosure is not limited thereto, and each electrode RME may further include a transparent conductive material. For example, each electrode RME may include a material such as ITO, IZO, and ITZO. In an embodiment, each of the electrodes RME may have a structure in which at least one transparent conductive material and at least one metal layer having high reflectivity may be stacked, or may be formed as one layer or a layer including them. For example, each electrode RME may have a stacked structure of ITO/Ag/ITO, ITO/Ag/IZO, ITO/Ag/ITZO/IZO, or the like within the spirit and the scope of the disclosure.

The first insulating layer PAS1 is disposed on the via layer VIA and the electrodes RME. The first insulating layer PAS1 may entirely cover or overlap the electrodes RME. The first insulating layer PAS1 may protect the electrodes RME, while insulating them from each other. The first insulating layer PAS1 may prevent the light emitting element ED disposed thereon from being damaged by direct contact with the electrode RME.

In an example embodiment, the first insulating layer PAS1 may have stepped portions such that the top surface thereof is partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The first insulating layer PAS1 may include contact portions CT1 and CT2 that expose a part of the top surface of each electrode RME. The contact portions CT1 and CT2 may penetrate the first insulating layer PAS1, and the connection electrodes CNE, which will be described later, may be in contact with the exposed electrodes RME through the contact portions CT1 and CT2.

The bank BNL may be disposed on the first insulating layer PAS1. The bank BNL may be disposed to surround the display area DPA and the non-display area NDA, by including a portion extending in the first direction DR1 and the second direction DR2 in a plan view. The bank BNL may be disposed in a grid pattern in the display area DPA, and may be disposed across the boundary of each sub-pixel SPXn to distinguish the neighboring sub-pixels SPXn. The bank BNL may be disposed to surround the emission area EMA and the sub-region SA in the display area DPA, and the regions partitioned and opened by the bank BNL may be the emission area EMA and the sub-region SA.

The bank BNL may have a certain or given height, and in an embodiment, the height of the top surface of the bank BNL may be higher than that of the protruding pattern BP, and the thickness of the bank BNL may be equal to or greater than that of the protruding pattern BP. The bank BNL may prevent ink from overflowing to the adjacent sub-pixel SPXn in an inkjet printing step during the manufacturing process of the display device 10. The bank BNL may prevent inks in which different light emitting elements ED are dispersed for different sub-pixels SPXn in the display area DPA from being mixed with each other. Similar to the protruding pattern BP, the bank BNL may include polyimide, but is not limited thereto.

The light emitting elements ED may be arranged or disposed on the first insulating layer PAS1. The light emitting element ED may be disposed on the first electrode RME1 and the second electrode RME2 of each sub-pixel SPXn in the display area DPA.

The light emitting elements ED may be disposed above the first electrode RME1 and the second electrode RME2 spaced apart from each other in the second direction DR2 between the protruding patterns BP. The light emitting elements ED may be spaced apart from each other along the first direction DR1 in which the first electrode RME1 and the second electrode RME2 extend, and may be aligned substantially parallel to each other. The light emitting element ED may have a shape extending in one direction, and the extension length thereof may be greater than the gap between the first electrode RME1 and the second electrode RME2 spaced apart from each other in the second direction DR2. The light emitting elements ED may be arranged or disposed such that both ends thereof are located or disposed on the first electrode RME1 and the second electrode RME2, respectively, and the direction in which the first electrode RME1 and the second electrode RME2 extend and the direction in which the light emitting element ED extends may be substantially perpendicular to each other. However, the disclosure is not limited thereto, and the light emitting element ED may be disposed in a direction oblique to the extension direction of the first electrode RME1 and the second electrode RME2.

The light emitting element ED may include layers arranged or disposed in a direction parallel to the top surface of the first substrate SUB. The light emitting element ED of the display device 10 may be disposed such that one extension direction thereof is parallel to the first substrate SUB, and the semiconductor layers included in the light emitting element ED may be sequentially arranged or disposed in a direction parallel to the top surface of the first substrate SUB. However, the disclosure is not limited thereto. In case that the light emitting element ED has a different structure, the layers may be arranged or disposed in a direction perpendicular to the first substrate SUB.

The light emitting elements ED disposed in each sub-pixel SPXn may emit light of different wavelength bands depending on a material constituting the semiconductor layer. However, the disclosure is not limited thereto, and the light emitting elements ED disposed in each sub-pixel SPXn may emit light of the same color. The light emitting element ED may include semiconductor layers doped with different conductivity types, and may be oriented such that one end or an end of the light emitting element ED faces a specific or given direction by an electric field generated on the first electrode RME1 and the second electrode RME2.

The light emitting elements ED may include semiconductor layers, and a first end and a second end opposite thereto may be defined with respect to any one semiconductor layer. The light emitting element ED may be disposed such that the first end is disposed on the first electrode RME1 and the second end is disposed on the second electrode RME2. The first end of the light emitting element ED may be directed to the left side that is the other side in the second direction DR2.

The light emitting elements ED may be electrically connected to the first electrode RME1 and the second electrode RME2 while being in contact with the first connection electrode CNE1 and the second connection electrode CNE2, respectively. Since a part of the semiconductor layer is exposed at the end surface of the light emitting element ED extending in one direction, the exposed semiconductor layer may be in contact with the connection electrode CNE. The light emitting elements ED may be electrically connected to the electrode RME or the conductive layers below the via layer VIA through the connection electrodes CNE, and may be applied with an electrical signal to emit light of a specific or given wavelength band.

The second insulating layer PAS2 may be disposed on the light emitting elements ED. In one example, the second insulating layer PAS2 is disposed to partially surround the outer surfaces of the light emitting elements ED without covering or overlapping both sides or both ends of the light emitting element ED. The portion of the second insulating layer PAS2 disposed on the light emitting element ED may extend in the first direction DR1 in a plan view to form a linear or an island-shaped pattern or a substantially island-shaped pattern. The second insulating layer PAS2 may protect the light emitting elements ED while fixing the light emitting elements ED during the manufacturing process of the display device 10. Further, the second insulating layer PAS2 may be disposed to fill the space between the light emitting element ED and the first insulating layer PAS1 thereunder.

Furthermore, the second insulating layer PAS2 may also be disposed above the protruding pattern BP and on the bank BNL in the display area DPA. The second insulating layer PAS2 may be disposed on the first insulating layer PAS1 while exposing the both sides of the light emitting element ED and partially exposing the portions where the electrodes RME are disposed. The shape of the second insulating layer PAS2 may be formed through steps of entirely disposing it on the first insulating layer PAS1 and partially removing it to expose the both sides of the light emitting element ED, during the manufacturing process of the display device 10.

The second insulating layer PAS2 may also be partially disposed in the sub-region SA. In a step of separating the electrode line after disposing the light emitting elements ED, the first insulating layer PAS1 and the second insulating layer PAS2 may be partially removed, and a part of the via layer VIA may be exposed in the separation portion ROP. The third insulating layer PAS3 may be disposed on or directly disposed on the exposed portion of the via layer VIA.

The connection electrodes CNE (CNE1 and CNE2) and the third insulating layer PAS3 may be arranged or disposed on the second insulating layer PAS2.

The connection electrodes CNE are arranged or disposed on the light emitting elements ED and the electrode RME. The connection electrodes CNE may be partially disposed on the second insulating layer PAS2 and may be insulated from another connection electrode CNE by the second insulating layer PAS2 and the third insulating layer PAS3. Each of the connection electrodes CNE may be in contact with the light emitting element ED and the electrodes RME.

Among the connection electrodes CNE, the first connection electrode CNE1 and the second connection electrode CNE2 are disposed in the display area DPA. The first connection electrode CNE1 may have a shape extending in the first direction DR1 and may be disposed on the first electrode RME1. The first connection electrode CNE may be in contact with the first electrode RME1 through a first contact portion CT1 exposing the top surface of the first electrode RME1, and may be in contact with the first ends of the light emitting elements ED. The second connection electrode CNE2 may have a shape extending in the first direction DR1 and may be disposed on the second electrode RME2. The second connection electrode CNE2 may be in contact with the second electrode RME2 through a second contact portion CT2 exposing the top surface of the second electrode RME2, and may be in contact with the second ends of the light emitting elements ED. The first connection electrode CNE1 and the second connection electrode CNE2 may transmit the electrical signal applied to the first electrode RME1 or the second electrode RME2 to any one end or an end of the light emitting element ED. Each of the first connection electrode CNE1 and the second connection electrode CNE2 may be in direct contact with the semiconductor layer exposed at both end surfaces of the light emitting element ED.

The contact portions CT1 and CT2 may be disposed so as not to overlap the light emitting elements ED in the second direction DR2. For example, the contact portions CT1 and CT2 may be formed to be spaced apart from the area, in which the light emitting elements ED are disposed, in the first direction DR1. Although it is illustrated in the drawing that the contact portions CT1 and CT2 are arranged or disposed in the sub-region SA, the disclosure is not limited thereto, and the contact portion CT1 and CT2 may be formed at the portion in the emission area EMA where there is no light emitting element ED.

The connection electrodes CNE may be spaced apart from each other in the second direction DR2 in a plan view. The first connection electrode CNE1 and the second connection electrode CNE2 may not be connected or directly connected to each other while being spaced apart from each other by a certain or given gap.

The connection electrodes CNE may include a conductive material. For example, they may include ITO, IZO, ITZO, aluminum (Al), or the like within the spirit and the scope of the disclosure. As an example, the connection electrodes CNE may include a transparent conductive material, and light emitted from the light emitting element ED may pass through the connection electrodes CNE and proceed toward the electrodes RME. However, the disclosure is not limited thereto.

The third insulating layer PAS3 is disposed on the second connection electrode CNE2 or the fourth connection electrode CNE4, and the second insulating layer PAS2. The third insulating layer PAS3 may be disposed on the entire second insulating layer PAS2 to cover or overlap the second connection electrode CNE2, and the first connection electrode CNE1 may be disposed on the third insulating layer PAS3. The third insulating layer PAS3 may be disposed on the entire via layer VIA except the region where the first connection electrode CNE1 is disposed. The third insulating layer PAS3 may be disposed above the protruding pattern BP and the bank BNL in addition to the first insulating layer PAS1 and the second insulating layer PAS2. The third insulating layer PAS3 may insulate the first connection electrode CNE1 and the second connection electrode CNE2 to prevent direct contact therebetween.

In an embodiment, the third insulating layer PAS3 may be omitted in the display device 10. Accordingly, the connection electrodes CNE may be disposed on or directly disposed on the second insulating layer PAS2 to be on substantially a same layer.

Although not shown in the drawings, another insulating layer may be further disposed on the third insulating layer PAS3. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. However, the disclosure is not limited thereto.

Figure 6:
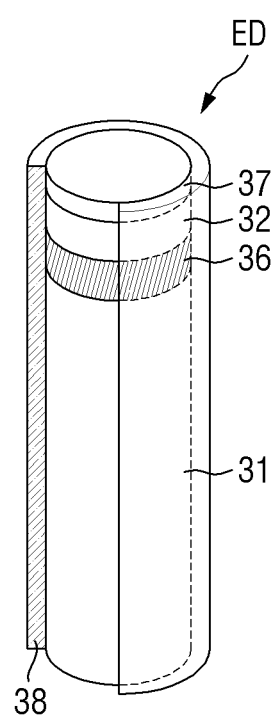
FIG. 6 is a schematic view of a light emitting element according to one embodiment.

FIG. 6 is a schematic view of a light emitting element according to one embodiment.

Referring to FIG. 6, the light emitting element ED may be a light emitting diode. The light emitting element ED may be an inorganic light emitting diode made of an inorganic material and having a size of nano-meter to micro-meter. The light emitting element ED may be aligned between two electrodes having polarity in case that an electric field is formed in a specific or given direction between two electrodes opposing each other.

The light emitting element ED according to one embodiment may have a shape elongated in one direction. The light emitting element ED may have a shape substantially of a cylinder, a rod, a wire, a tube, or the like within the spirit and the scope of the disclosure. However, the shape of the light emitting element ED is not limited thereto, and the light emitting element ED may have a substantially polygonal prism shape such as a substantially regular cube, a substantially rectangular parallelepiped and a substantially hexagonal prism, or may have various shapes such as a shape elongated in one direction and having an outer surface partially inclined.

The light emitting element ED may include a semiconductor layer doped with any conductivity type (for example, p-type or n-type) impurities. The semiconductor layer may emit light of a specific or given wavelength band by receiving an electrical signal applied from an external power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN and InN. The n-type dopant doped into the first semiconductor layer 31 may be Si, Ge, Sn, or the like within the spirit and the scope of the disclosure.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN and InN. The p-type dopant doped into the second semiconductor layer 32 may be Mg, Zn, Ca, Se, Ba, or the like within the spirit and the scope of the disclosure.

Although it is illustrated in the drawing that the first semiconductor layer 31 and the second semiconductor layer 32 are formed as one layer or a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. In case that the light emitting layer 36 may include a material having a multiple quantum well structure, quantum layers and well layers may be alternately stacked each other. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. In case that the light emitting layer 36 has a structure in which quantum layers and well layers may be alternately stacked each other in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked each other, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating layer 38 may be arranged or disposed to surround the outer surfaces of the semiconductor layers and electrode layers described above. For example, the insulating layer 38 may be disposed to surround at least the outer surface of the light emitting layer 36, and may be formed to expose both ends of the light emitting element ED in the longitudinal direction. Further, in a schematic cross-sectional view, the insulating layer 38 may have a top surface, which is rounded in a region adjacent to at least one end or an end of the light emitting element ED.

The insulating layer 38 may include a material having insulating properties, such as silicon oxide ($SiO_x$), silicon nitride ($SiN_x$), silicon oxynitride ($SiO_xN_y$), aluminum nitride ($AlN_x$), and aluminum oxide ($AlO_x$). It is illustrated in the drawing that the insulating layer 38 is formed as a single layer, but the disclosure is not limited thereto. In an embodiment, the insulating layer 38 may be formed in a multilayer structure having layers are stacked therein.

The insulating layer 38 may function to protect the members. The insulating layer 38 may prevent an electrical short circuit that may likely occur at the light emitting layer 36 in case that an electrode to which an electrical signal is transmitted is in direct contact with the light emitting element ED. The insulating layer 38 may prevent a decrease in luminous efficiency of the light emitting element ED.

Further, the insulating layer 38 may have an outer surface which is surface-treated. The light emitting elements ED may be aligned in such a way of spraying the ink in which the light emitting elements ED are dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink.

The light emitting element ED may include the light emitting layer 36 disposed between the first semiconductor layer 31 and the second semiconductor layer 32, and may emit light of a specific or given wavelength band through the current flowing in the first and second connection electrodes CNE1 and CNE2 which are in ohmic contact.

The electrodes RME disposed in the display area DPA may be arranged or disposed to be spaced apart from each other by a distance. The electrodes RME may be arranged or disposed along the second direction DR2. The electrodes RME may be formed by a photomask process. By way of example, an electrode layer may be formed entirely on the via layer VIA and the protruding pattern BP, and a photoresist formed on the electrode layer may be exposed through a photomask except for the region where the electrodes RME may be formed. However, in the process of exposing the photoresist formed on the electrode layer through the photomask and etching the exposed electrode layer, with reference to FIG. 1, although the separation distance between the electrodes RME positioned on the left, right, and lower sides of the display area DPA is formed large enough not to cause a short circuit, the separation distance between the electrodes RME positioned on the upper side (for example, the display area DPA adjacent to the pad area PA) of the display area DPA is smaller than the separation distance between the electrodes RME positioned on the left, right, and lower sides of the display area DPA, so that a short circuit may occur.

Dummy patterns (for example, dummy pixels) (at least a part of which are cut and removed from the finished product) may be disposed in the non-display area NDA adjacent to the left, right, and lower sides of the display area DPA, but the dummy patterns may not be disposed in the non-display area NDA adjacent to the upper side of the display area DPA since pad electrodes PAD are disposed therein. Accordingly, in the process of forming the electrodes RME by a photomask process, diffraction degrees between the non-display area NDA adjacent to the left, right, and lower sides of the display area DPA and the non-display area NDA adjacent to the upper side of the display area DPA may be different, resulting in a difference in actual exposure amount.

However, according to an embodiment, a dummy electrode may be further provided even in the non-display area NDA adjacent to the upper side of the display area DPA, so that in the process of forming the electrodes RME by a photomask process, it is possible to prevent a phenomenon in which a difference in actual exposure amount occurs due to the different diffraction degrees between the non-display area NDA adjacent to the left, right, and lower sides of the display area DPA and the non-display area NDA adjacent to the upper side of the display area DPA. This will be described later with reference to FIGS. 7 to 9.

Figure 7:
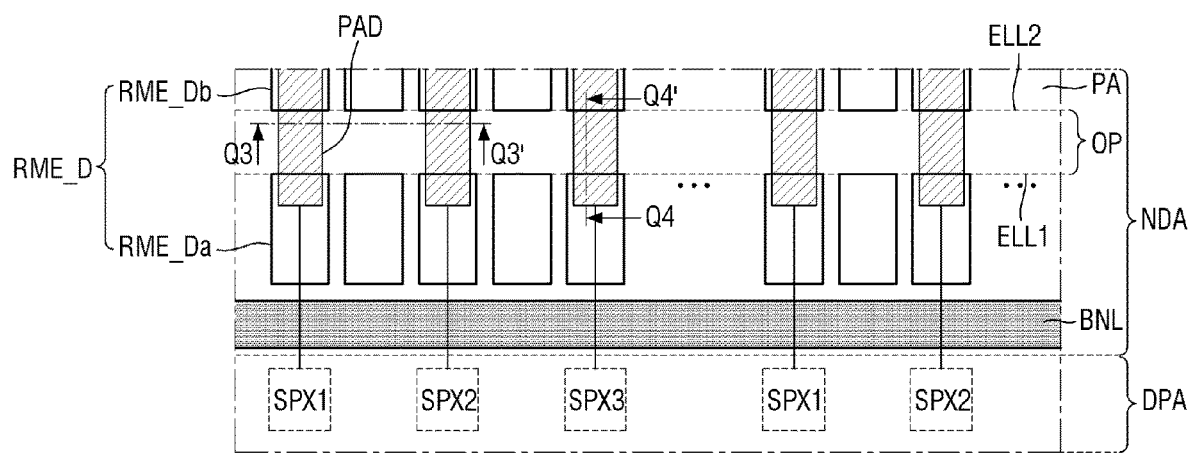
FIG. 7 is a schematic plan view illustrating a pad area and a display area around the pad area in the display device according to one embodiment.
Figure 7:
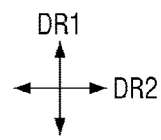
Figure 8:
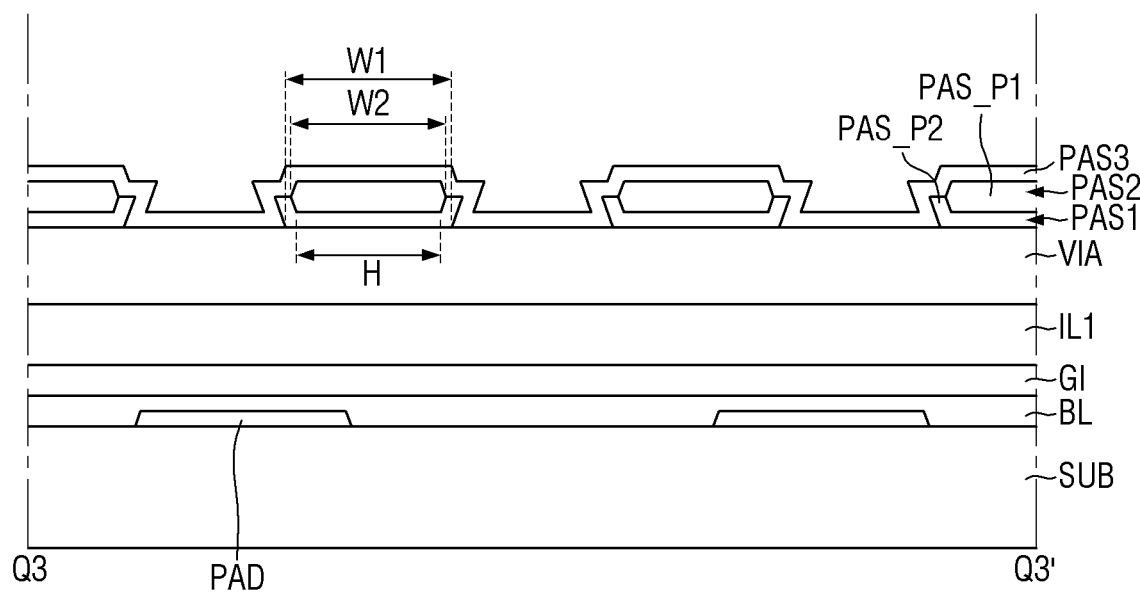
FIG. 8 is a schematic cross-sectional view taken along line Q3-Q3' of FIG. 7.
Figure 9:
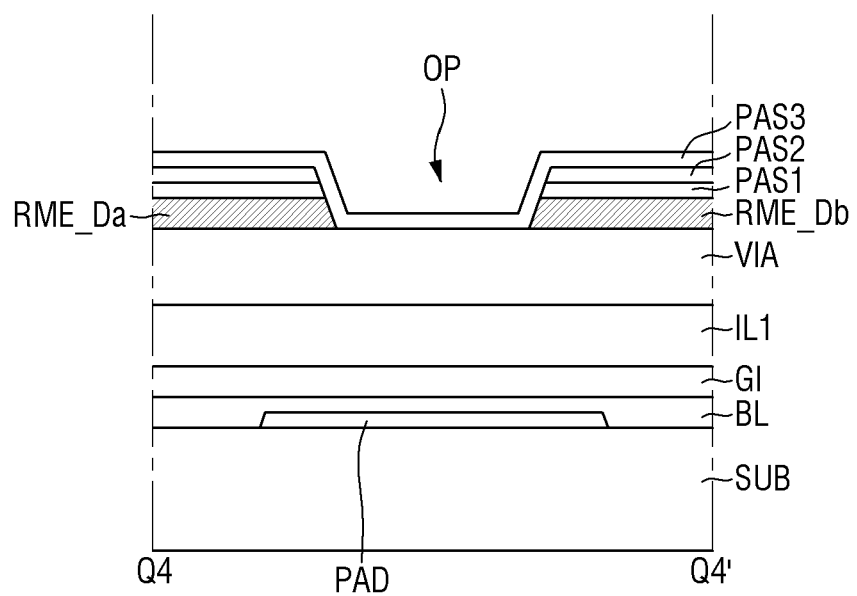
FIG. 9 is a schematic cross-sectional view taken along line Q4-Q4' of FIG. 7.

FIG. 7 is a schematic plan view illustrating a pad area and a display area around the pad area in the display device according to one embodiment. FIG. 8 is a schematic cross-sectional view taken along line Q3-Q3' of FIG. 7. FIG. 9 is a schematic cross-sectional view taken along line Q4-Q4' of FIG. 7.

Referring to FIGS. 7 to 9, the display device according to one embodiment may include at least one pad electrode PAD disposed on the first substrate SUB (see FIG. 4) of the pad area PA and connected to the display area DPA (see FIG. 2), and at least one dummy electrode REM_D overlapping the pad electrode PAD without being connected to the display area DPA.

The at least one dummy electrode REM_D may be provided plurally, and the at least one pad electrode PAD may be provided plurally.

The pad electrodes PAD may be connected to the sub-pixels SPX1, SPX2, and SPX3, respectively.

The dummy electrode RME_D may include a first dummy electrode portion RME_Da overlapping one end or an end of the pad electrode PAD, and a second dummy electrode portion RME_Db overlapping the other end of the pad electrode PAD.

The first dummy electrode portion RME_Da and the second dummy electrode portion RME_Db may be spaced apart from each other in the first direction DR1.

The dummy electrodes RME_D and the pad electrodes PAD may be arranged or disposed in the second direction DR2.

The dummy electrodes RME_D may further include the dummy electrode RME_D that does not overlap the pad electrode PAD. The dummy electrode RME_D that overlaps the pad electrode PAD and the dummy electrode RME_D that does not overlap the pad electrode PAD may be alternately arranged or disposed along the second direction DR2, but the disclosure is not limited thereto.

A first extension line ELL1 formed by extending the other ends of the first dummy electrode portions RME_Da of the dummy electrodes RME_D along the second direction DR2, and a second extension line ELL2 formed by extending one ends of the second dummy electrode portions RME_Db of the dummy electrodes RME_D along the second direction DR2 may be further defined.

In a space between the first extension line ELL1 and the second extension line ELL2, an opening OP, which is a space formed by the first dummy electrode portion RME_Da and the second dummy electrode portion RME_Db being spaced apart from each other in the first direction DR1, may be defined.

The opening OP may extend along the second direction DR2.

The opening OP may be disposed to overlap the pad electrode PAD.

Hereinafter, a cross-sectional structure of the display device in the opening OP will be described in more detail.

In the opening, the display device may include the first substrate SUB described above with reference to FIGS. 4 and 5, the pad electrode PAD on the first substrate SUB, at least one lower insulating layer on the pad electrode PAD, the via layer VIA on the at least one lower insulating layer, the first insulating layer PAS1 on the via layer VIA, the second insulating layer PAS2 on the first insulating layer PAS1, and the third insulating layer PAS3 on the second insulating layer PAS2.

The pad electrode PAD may be disposed on the first conductive layer described above with reference to FIGS. 4 and 5. For example, the pad electrode PAD may be disposed on a same layer as the lower metal layer BML and may include the same material or similar material as the lower metal layer BML.

The dummy electrode RME_D may be disposed on a same layer as the first and second electrodes RME1 and RME2 described above with reference to FIGS. 4 and 5. The dummy electrode RME_D may be formed of the same material or similar material as the first and second electrodes RME1 and RME2. However, the dummy electrode RME_D may be electrically insulated from the first and second electrodes RME1 and RME2.

The first insulating layer PAS1 may include first insulating patterns PAS_P1 spaced apart from each other with a space that overlaps the pad electrode PAD therebetween. The second insulating layer PAS2 may include second insulating patterns PAS_P2 that overlap the first insulating patterns PAS_P1. The first insulating pattern PAS_P1 may include a groove H recessed downward from the top surface thereof. The second insulating pattern PAS_P2 may fill the groove H.

The first insulating pattern PAS_P1 may be disposed on or directly disposed on the via layer VIA, and the second insulating pattern PAS_P2 may be disposed on or directly disposed on the top surface of the first insulating pattern PAS_P1.

The bottom surface of the first insulating pattern PAS_P1 in direct contact with the via layer VIA may have a first width W1, and the second insulating pattern PAS_P2 may have an average second width W2. The first width W1 may be greater than the second width W2.

The third insulating layer PAS3 may be in direct contact with the top surfaces of the first insulating pattern PAS_P1, the second insulating pattern PAS_P2, and the via layer VIA.

As shown in FIG. 9, the side surfaces of the first insulating pattern may be aligned with the side surfaces of the first dummy electrode portion RME_Da and the second dummy electrode portion RME_Db adjacent to the opening OP, respectively. Further, the side surfaces of the second insulating pattern may be aligned with the side surfaces of the first dummy electrode portion RME_Da and the second dummy electrode portion RME_Db adjacent to the opening OP, respectively. Each of the first insulating pattern and the second insulating pattern may not be disposed in the opening OP.

The third insulating layer PAS3 may be in direct contact with the top surface of the second insulating pattern, the side surface of the second insulating pattern, the side surface of the first insulating pattern, the side surface of the first dummy electrode portion RME_Da, and the side surface of the second dummy electrode portion RME_Db. The third insulating layer PAS3 may be further disposed in the opening OP. The third insulating layer PAS3 may be disposed on or directly disposed on the top surface of the via layer VIA in the opening OP.

As described above, the dummy patterns (for example, dummy pixels) may be disposed in the non-display area NDA adjacent to the left, right, and lower sides of the display area DPA, but the dummy patterns may not be disposed in the non-display area NDA adjacent to the upper side of the display area DPA since the pad electrodes PAD are disposed therein. Accordingly, in the process of forming the electrodes RME by a photomask process, diffraction degrees between the non-display area NDA adjacent to the left, right, and lower sides of the display area DPA and the non-display area NDA adjacent to the upper side of the display area DPA may be different, resulting in a difference in actual exposure amount.

However, according to an embodiment, a dummy electrode may be further provided even in the non-display area NDA adjacent to the upper side of the display area DPA, so that in the process of forming the electrodes RME by a photomask process, it is possible to prevent a phenomenon in which a difference in actual exposure amount occurs due to the different diffraction degrees between the non-display area NDA adjacent to the left, right, and lower sides of the display area DPA and the non-display area NDA adjacent to the upper side of the display area DPA.

Accordingly, a separation distance between the electrodes RME positioned on the upper side (for example, the display area DPA adjacent to the pad area PA) of the display area DPA may also be sufficiently secured, so that a short circuit between the electrodes RME positioned on the upper side (for example, the display area DPA adjacent to the pad area PA) of the display area DPA may be prevented from occurring, thereby improving the alignment of the light emitting element ED.

Hereinafter, a display device according to an embodiment will be described. In the following embodiments, the same components as those of the above-described embodiment are denoted by the same reference numerals, and a description thereof will be omitted or simplified.

Figure 10:
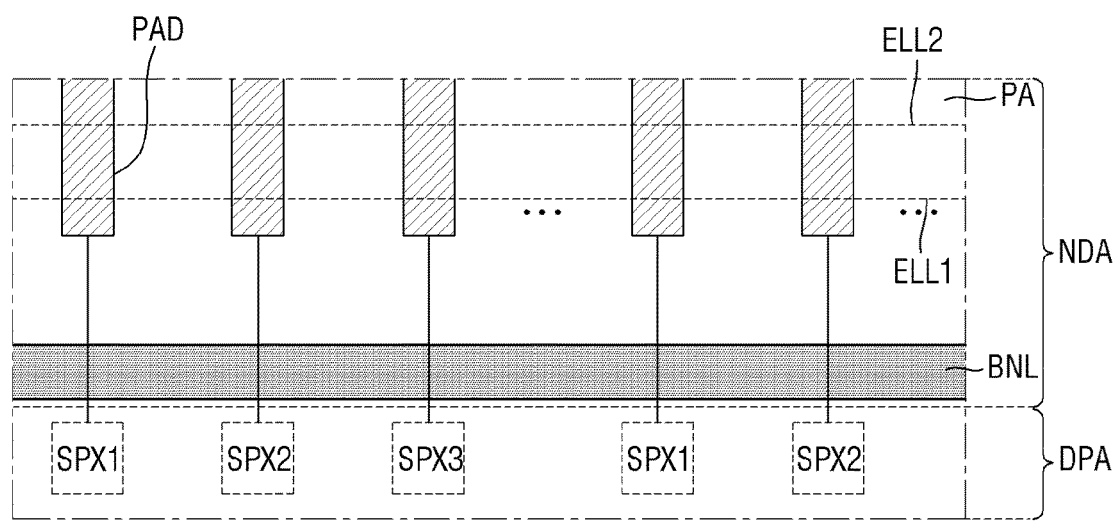
FIG. 10 is a schematic plan view illustrating a pad area and a display area around the pad area in a display device according to an embodiment.
Figure 10:
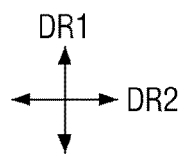

FIG. 10 is a schematic plan view illustrating a pad area and a display area around the pad area in a display device according to an embodiment.

Referring to FIG. 10, the display device according to an embodiment differs from the display device of FIG. 7 in that it does not include the dummy electrode REM_D.

The display device according to an embodiment may not include the dummy electrode REM_D. For example, the display device of FIG. 10 may not include the dummy electrode RME_D of FIG. 7 having the first dummy electrode portion RME_Da and the second dummy electrode portion RME_Db that overlaps the other end of the pad electrode PAD. As will be described later with reference to FIG. 18, a part of a dummy electrode RME_D' corresponding to the first dummy electrode portion RME_Da and the second dummy electrode portion RME_Db of FIG. 7, and a part of the dummy electrode RME_D' overlapping the opening OP may be removed through an etching process.

A cross-sectional shape of the display device of FIG. 10 may be the same as that of the display device of FIG. 8. Accordingly, a detailed description of the display device of FIG. 10 is omitted.

Figure 11:
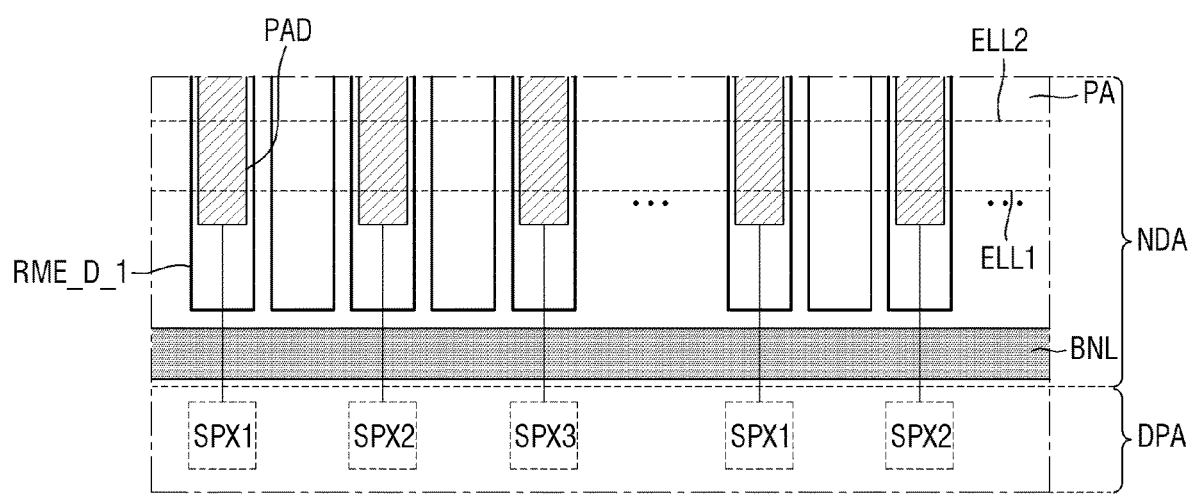
FIG. 11 is a schematic plan view illustrating a pad area and a display area around the pad area in a display device according to an embodiment.

FIG. 11 is a schematic plan view illustrating a pad area and a display area around the pad area in a display device according to an embodiment.

Referring to FIG. 11, the display device according to an embodiment differs from the display device of FIG. 7 in that a dummy electrode RME_D_1 may be integrally formed.

By way of example, in the display device according to an embodiment, the dummy electrode RME_D_1 may be integrally formed.

Since other descriptions have been made with reference to FIG. 7, repeated descriptions are omitted.

FIGS. 12 to 19 are schematic cross-sectional views for each process step in a method of manufacturing a display device according to one embodiment.

Figure 12:
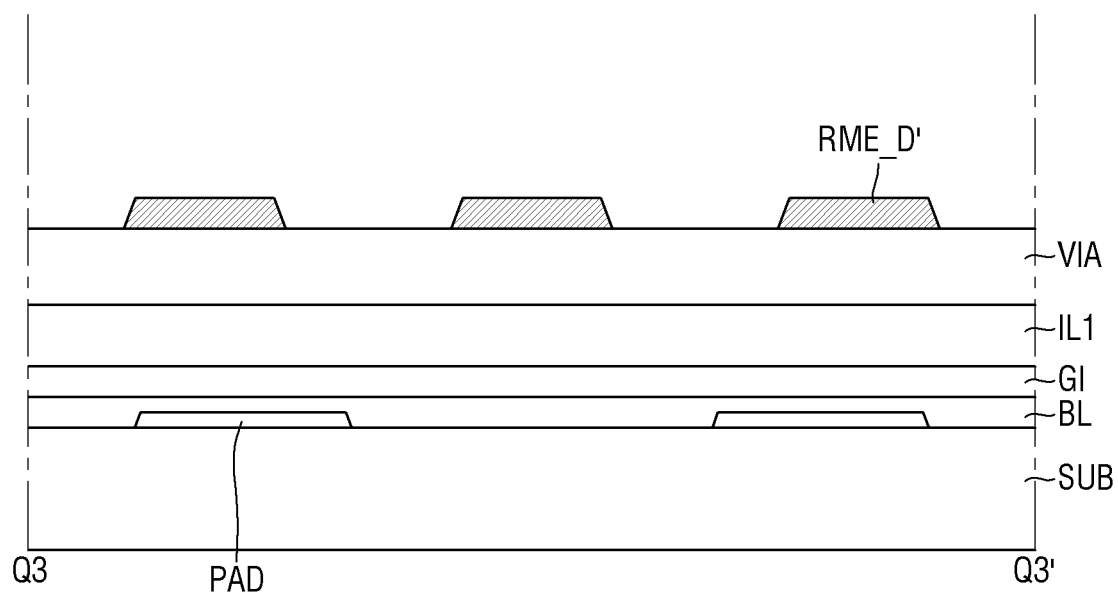
FIGS. 12 to 19 are schematic cross-sectional views for each process step in a method of manufacturing a display device according to one embodiment.

First, referring to FIG. 12, a method of manufacturing the display device according to one embodiment may include: preparing the first substrate SUB in which the display area and the pad area positioned around the display area are defined; arranging the pad electrodes PAD connected to the display area, on the first substrate SUB of the pad area; disposing the via layer VIA on the pad electrodes PAD; and arranging, on the via layer VIA, dummy electrodes RME_D' to overlap the pad electrode PAD.

Between the step of arranging the pad electrodes PAD and the step of providing the via layer VIA, steps of forming the buffer layer BL, forming the first gate insulating layer GI, and forming the first interlayer insulating layer IL1 may be further included.

The dummy electrode RME_D' may not be connected to the display area.

Figure 13:
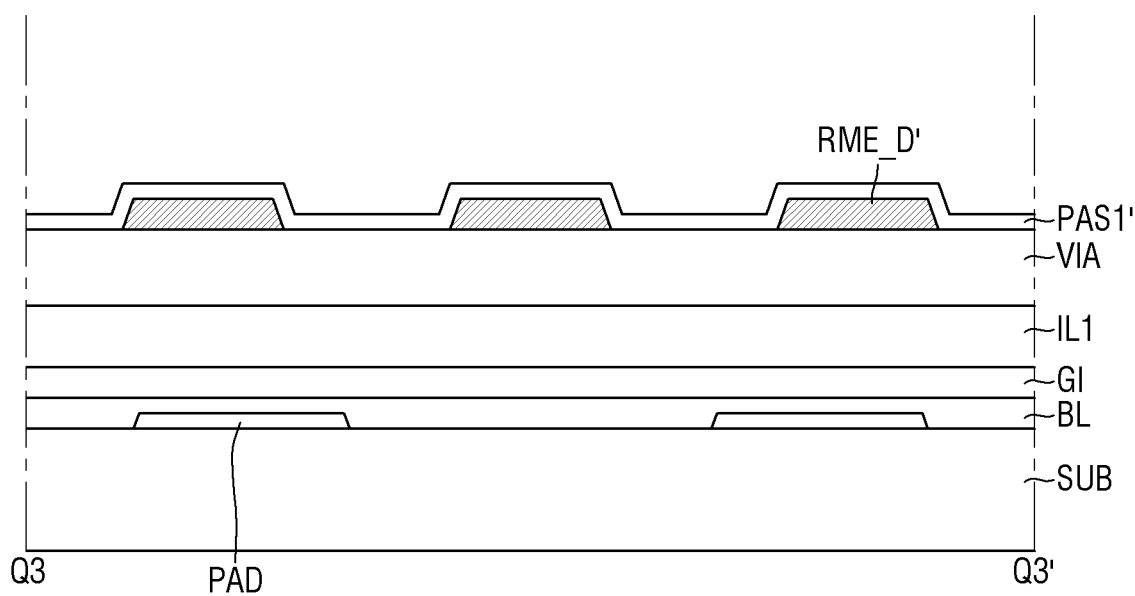

Subsequently, as shown in FIG. 13, a first insulating layer PAS1' may be entirely formed on the dummy electrodes RME_D'.

The first insulating layer PAS1' may include an inorganic insulating material or an organic insulating material. However, the disclosure is not limited thereto.

Figure 14:
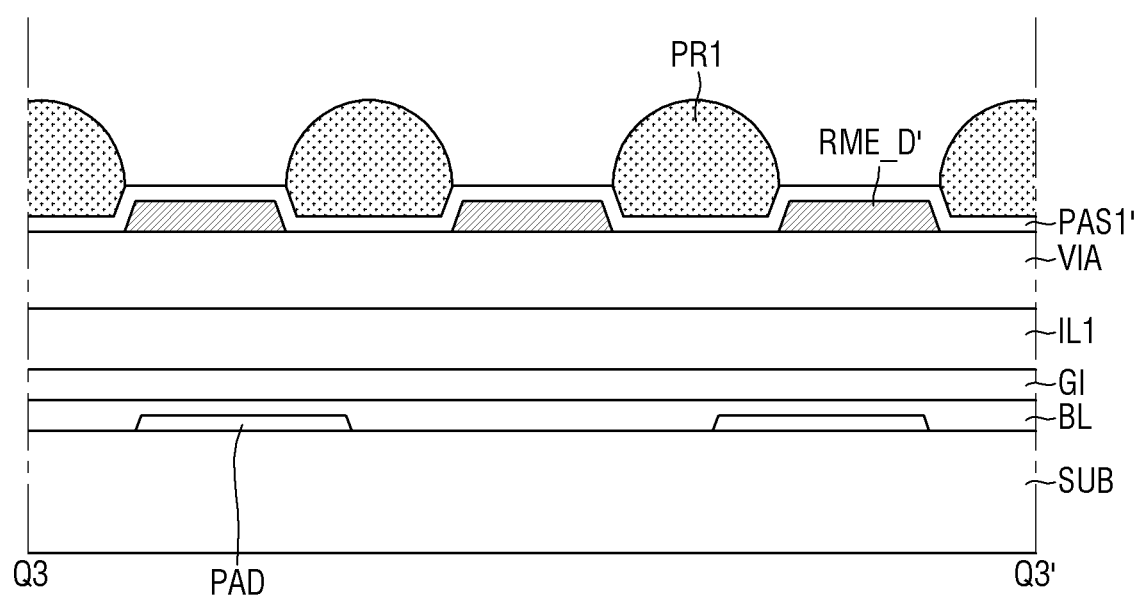

As shown in FIG. 14, a first photoresist PR1 is formed. The first photoresist PR1 may be formed on the first insulating layer PAS1'. The first photoresist PR1 may be formed to overlap a space between the adjacent dummy electrodes RME_D'.

Figure 15:
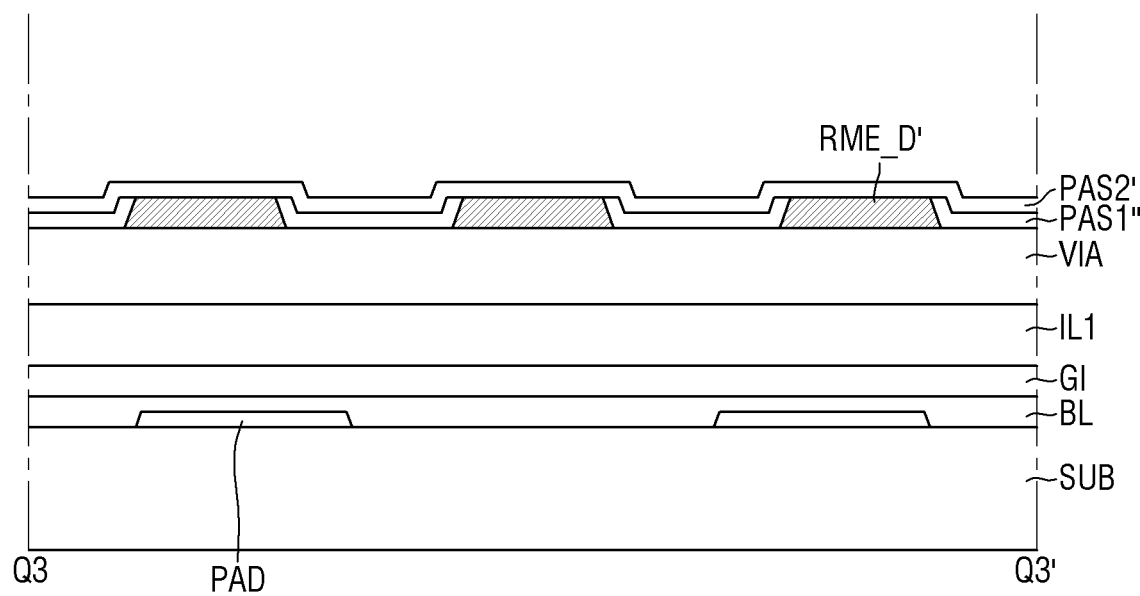

Subsequently, as shown in FIG. 15, a first insulating layer PAS1" is formed using the first photoresist PR1. The first insulating layer PAS1" may be formed to overlap the space between the adjacent dummy electrodes RME_D'.

A second insulating layer PAS2' is formed entirely on the first insulating layer PAS1" and the dummy electrode RME_D'.

The second insulating layer PAS2' may include an inorganic insulating material or an organic insulating material. However, the disclosure is not limited thereto.

Figure 16:
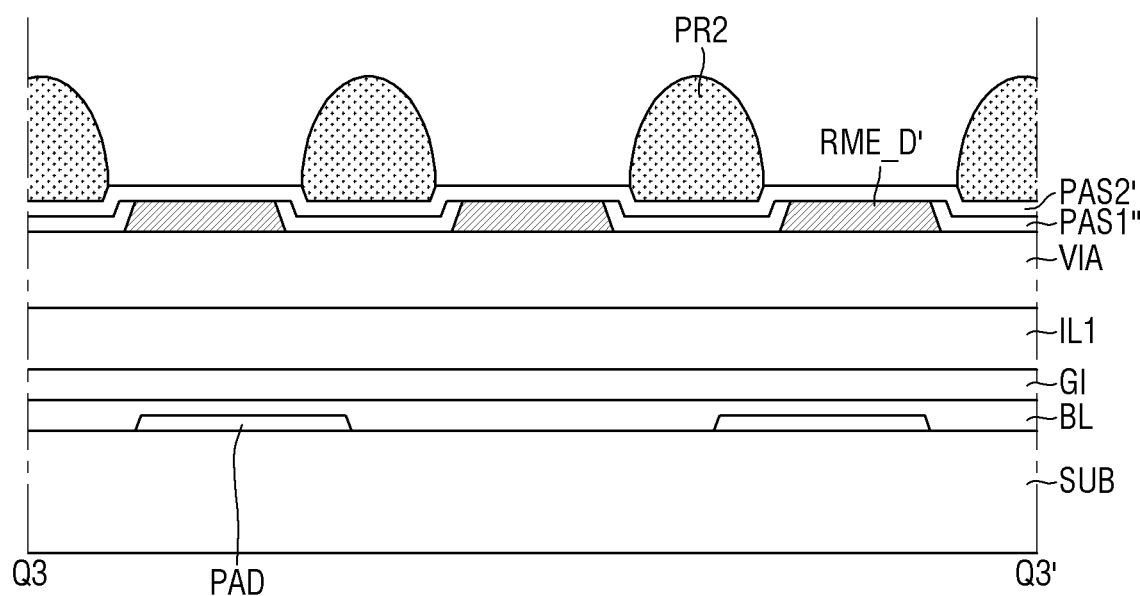

Subsequently, as shown in FIG. 16, a second photoresist PR2 is formed on the second insulating layer PAS2'.

The second photoresist PR2 may be formed on the second insulating layer PAS2'. The second photoresist PR2 may be formed to overlap the space between the adjacent dummy electrodes RME_D'.

Figure 17:
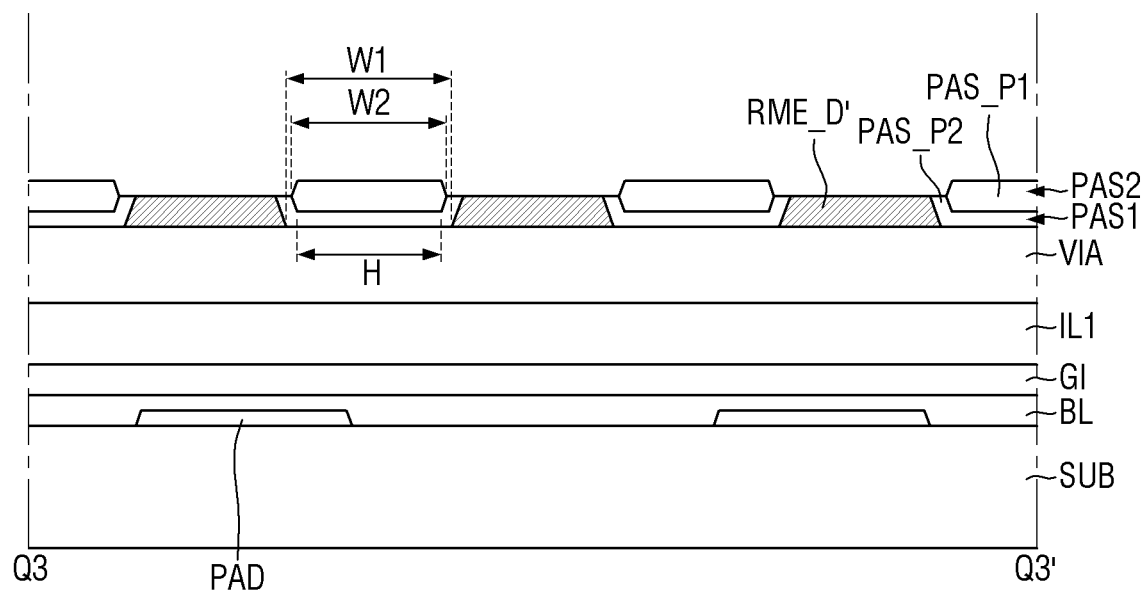

Subsequently, as shown in FIG. 17, the first insulating layer PAS1 and the second insulating layer PAS2 are formed using the second photoresist PR2. The first insulating layer PAS1 and the second insulating layer PAS2 may each be formed to overlap the space between the adjacent dummy electrodes RME_D'.

The first insulating layer PAS1 may include the first insulating patterns PAS_P1 spaced apart from each other with a space that overlaps the pad electrode PAD therebetween. The second insulating layer PAS2 may include the second insulating patterns PAS_P2 that overlap the first insulating patterns PAS_P1. The first insulating pattern PAS_P1 may include the groove H recessed downward from the top surface. The second insulating pattern PAS_P2 may fill the groove H.

Figure 18:
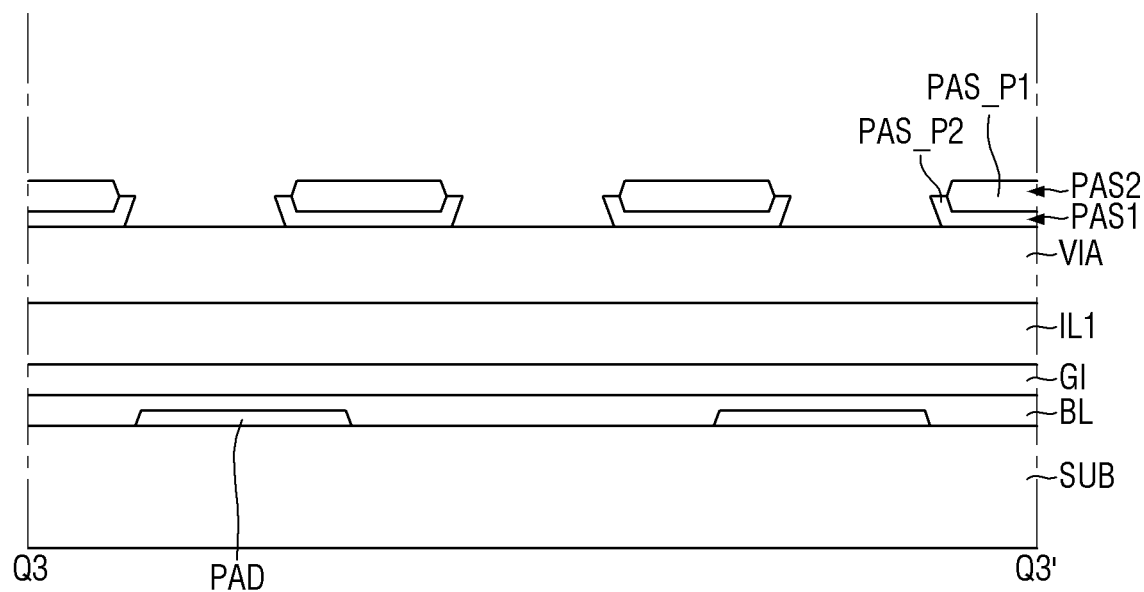

Subsequently, as shown in FIG. 18, a part of the dummy electrode RME_D' is removed. The partial removal of the dummy electrode RME_D' may be performed through an etching process. The etching process may include wet etching or dry etching. Accordingly, as shown in FIG. 18, the first insulating layer PAS1 and the second insulating layer PAS2 may remain. A region from which a part of the dummy electrode RME_D' is removed may be the opening OP of FIG. 7.

In an embodiment, instead of removing a part of the dummy electrode RME_D', the entire dummy electrode RME_D' may be removed. For example, a part of a dummy electrode RME_D' corresponding to the first dummy electrode portion RME_Da and the second dummy electrode portion RME_Db of FIG. 7, and a part of the dummy electrode RME_D' overlapping the opening OP may be removed through an etching process. A final structure in which the entire dummy electrode RME_D' has been removed instead of removing a part of the dummy electrode RME_D' has been described above with reference to FIG. 10.

Figure 19:
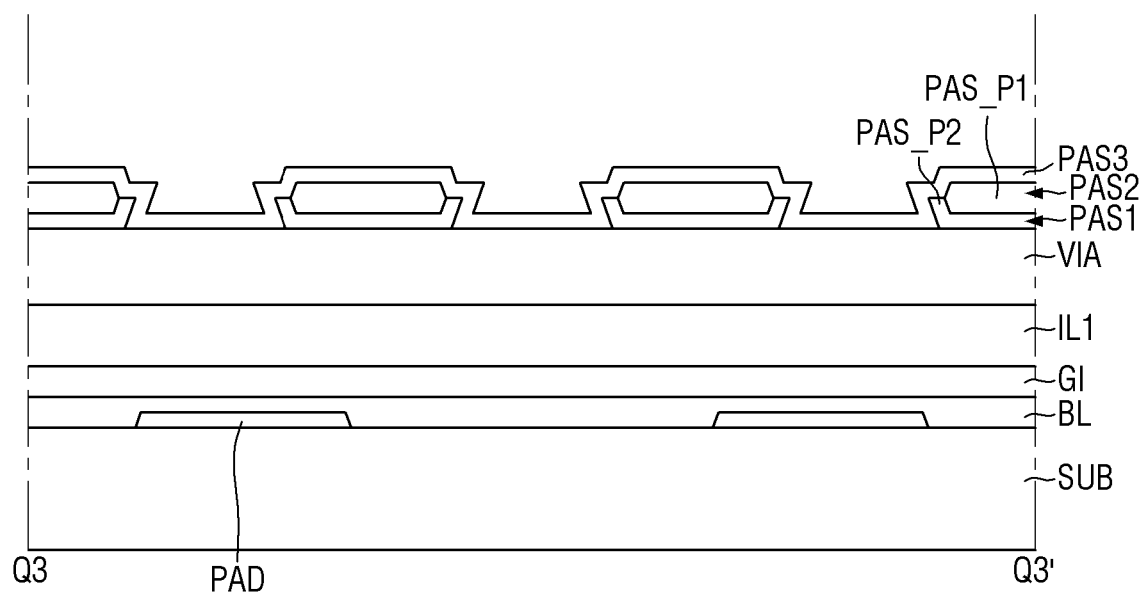

Subsequently, as shown in FIG. 19, the third insulating layer PAS3 is formed entirely. The third insulating layer PAS3 may include an inorganic insulating material or an organic insulating material. However, the disclosure is not limited thereto.

The third insulating layer PAS3 may be in direct contact with the top surfaces of the first insulating pattern PAS_P1, the second insulating pattern PAS_P2, and the via layer VIA.

Although embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A display device comprising:
a substrate including a display area and a pad area adjacent to the display area;
a pad electrode disposed on the substrate in the pad area and connected to the display area; and
first and second dummy electrodes spaced apart from each other, overlapping different ends of the pad electrode in a plan view, and not connected to the display area.

2. The display device of claim 1, wherein
the substrate further includes a non-display area adjacent to each of left, right, lower, and upper sides of the display area in a plan view, the pad area corresponding to a portion of the non-display area adjacent to the upper side of the display area in a plan view, and the display device comprises a plurality of dummy patterns disposed in the non-display area at each of the left, right, lower and upper sides of the display area.

3. The display device of claim 1, further comprising:
a light emitting element disposed on the substrate and in the display area; and
first and second electrodes electrically connected to opposite ends of the light emitting element,
the first electrode is electrically connected to a first voltage wire through a transistor,
the second electrode is directly electrically connected to a second voltage wire,
a higher voltage is applied to the first voltage wire than the second voltage wire, and
the first and second dummy electrodes and the first and second electrodes comprise a same material and are formed from a same layer.

4. A display device comprising:
a substrate including a display area and a pad area adjacent to the display area;
at least one pad electrode disposed on the substrate in the pad area and connected to the display area; and
at least one dummy electrode overlapping the at least one pad electrode and not connected to the display area, wherein
the at least one dummy electrode includes:
a first dummy electrode portion overlapping an end of the at least one pad electrode; and
a second dummy electrode portion overlapping another end of the at least one pad electrode, and
the first dummy electrode portion and the second dummy electrode portion are spaced apart from each other in a first direction.

5. The display device of claim 4, wherein
the at least one dummy electrode includes a plurality of dummy electrodes, and
the at least one pad electrode includes a plurality of pad electrodes.

6. The display device of claim 5, wherein the plurality of dummy electrodes include the dummy electrode not overlapping the at least one pad electrode.

7. The display device of claim 5, wherein the plurality of dummy electrodes and the plurality of pad electrodes are disposed in a second direction intersecting the first direction, respectively.

8. The display device of claim 7, wherein
ends of first dummy electrode portions of the plurality of dummy electrodes extend in the second direction to form a first extension line,
ends of second dummy electrode portions of the plurality of dummy electrodes extend in the second direction to form a second extension line, and
an opening is formed by the first dummy electrode portion and the second dummy electrode portion spaced apart from each other in the first direction, is formed in a space between the first extension line and the second extension line, and extends in the second direction.

9. The display device of claim 8, wherein the opening overlaps the at least one pad electrode.

10. The display device of claim 8, further comprising:
at least one lower insulating layer disposed on the at least one pad electrode;
a via layer disposed on the at least one lower insulating layer; and a first insulating layer disposed on the via layer, wherein
the substrate, the at least one pad electrode, the at least one lower insulating layer, the a via layer, and the a first insulating layer are disposed in the opening, and
the first insulating layer includes first insulating patterns spaced apart from each other with a space overlapping the at least one pad electrode disposed between the first insulating patterns.

11. The display device of claim 10, further comprising:
a second insulating layer disposed on the first insulating layer,
wherein the second insulating layer includes second insulating patterns overlapping the first insulating patterns in the opening.

12. The display device of claim 11, wherein
the first insulating pattern includes a groove recessed downward from a top surface of the first insulating pattern, and
the second insulating pattern fills the groove of the first insulating pattern.

13. The display device of claim 12, further comprising:
a third insulating layer disposed on the second insulating layer,
wherein the third insulating layer directly contacts top surfaces of the first insulating pattern, the second insulating pattern, and the via layer.

14. A display device comprising:
a substrate including a display area and a pad area adjacent to the display area;
a pad electrode disposed on the substrate and connected to the display area;
at least one lower insulating layer disposed on the pad electrode;
a via layer disposed on the at least one lower insulating layer;
a first insulating layer disposed on the via layer; and
a second insulating layer disposed on the first insulating layer, wherein
the first insulating layer includes first insulating patterns spaced apart from each other with a space overlapping the pad electrode disposed between the first insulating patterns, and
the second insulating layer includes second insulating patterns overlapping the first insulating patterns.

15. The display device of claim 14, wherein
the first insulating pattern includes a groove recessed downward from a top surface of the first insulating pattern, and
the second insulating pattern fills the groove of the first insulating pattern.

16. The display device of claim 15, wherein a width of the second insulating pattern is less than a width of the first insulating pattern.

17. The display device of claim 15, wherein the second insulating pattern does not overlap the pad electrode.

18. The display device of claim 15, further comprising:
a third insulating layer disposed on the second insulating layer,
wherein the third insulating layer directly contacts top surfaces of the first insulating pattern, the second insulating pattern, and the via layer.

19. A method of manufacturing a display device, comprising:
preparing a substrate including a display area and a pad area adjacent to the display area;
disposing pad electrodes connected to the display area on the pad area;

disposing a via layer on the pad electrodes; and disposing dummy electrodes to overlap the pad electrode on the via layer, wherein the dummy electrode is not connected to the display area.

20. The method of claim 19, further comprising:

forming, between dummy electrodes adjacent to each other, first insulating patterns spaced apart from each other with a space overlapping the pad electrode disposed between the first insulating patterns.

21. The method of claim 20, further comprising:

forming second insulating patterns overlapping the first insulating patterns, wherein the forming of the second insulating patterns includes filling a groove of the first insulating pattern recessed downward from a top surface of the first insulating pattern with the second insulating pattern.

22. The method of claim 21, further comprising:

etching the dummy electrodes.

* * * * *